(12) United States Patent
May

(10) Patent No.: US 6,278,394 B1
(45) Date of Patent: Aug. 21, 2001

(54) SIGNAL PROCESSING CIRCUIT AND METHOD OF OPERATION

(75) Inventor: Michael R. May, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/400,257

(22) Filed: Sep. 21, 1999

(51) Int. Cl.[7] ..................................................... H03M 1/66

(52) U.S. Cl. ...................... 341/144; 341/143; 341/155; 341/156; 341/166; 341/167; 341/50; 341/76; 341/77; 341/162; 341/120; 341/141; 341/135; 327/303

(58) Field of Search ..................................... 341/143, 155, 341/144, 107, 100, 50, 76, 77, 118, 113, 55, 120

(56) References Cited

U.S. PATENT DOCUMENTS 6,137,429 * 10/2000 Chan et al. ........................... 341/143

* cited by examiner

Primary Examiner—Michael Tokar
Assistant Examiner—Lam T. Mai
(74) Attorney, Agent, or Firm—Robert L. King

(57) ABSTRACT

An analog-to-digital or digital-to-analog system contains a converter (706). The converter is supplied with a clock signal (CLK1) at a frequency fs derived from a crystal of a frequency fs/N. The frequency fs is derived from the fs/N crystal frequency by using an edge-triggered clock multiplier 705 which multiplies the crystal frequency by the factor N. The result is a low-cost clock solution that incorporates clock jitter around a localized frequency of fs/N. Sigma delta processing circuitry (702) is then used to place a null (e.g., low gain area) in the quantization noise at the same frequency where clock jitter noise is high in order to cancel the adverse cumulative effects of these two types of noise.

35 Claims, 6 Drawing Sheets

SIGNAL PROCESSING CIRCUIT AND METHOD OF OPERATION

FIELD OF THE INVENTION

The present invention relates generally to digital to analog (D/A) converters or analog-to-digital (A/D) converters, and more particularly to a converter that uses a lower frequency crystal clock source without suffering significant performance degradation due to clock jitter.

BACKGROUND OF THE INVENTION

In digital-to-analog (D/A) conversion circuits, it is desirable to obtain high precision conversion using low precision components. Sigma-delta modulators are often employed in pursuit of this object. In particular, sigma-delta converters allow a high-resolution signal to be translated to a lower resolution signal implementable using standard lower precision components. FIG. 1 illustrates an exemplary prior art sigma-delta conversion circuit denoted generally by the reference numeral 100. The sigma-delta conversion circuit 100 includes a sigma-delta modulator 102 and a digital-to-analog converter (DAC) 106.

The sigma-delta modulator 102 includes integrators 108 and 110, a quantizer 116, an adder 118, and a gain factor 112 in a feedback loop. The output of the quantizer 116 is provided as negative feedback to the summation circuit 118 and to the input of gain block 112. The output of the gain block 112 is provided as negative feedback to another summation circuit 114. The summation circuit 114 receives, as its other input, a digital input signal 120. For example, the digital input 120 may be 17 bit user data provided in a sequential stream. The quantizer 116 may be a 3-bit quantizer, for example. The input of integrator 108 is connected to the output of summation block 114. The output of integrator 108 is connected to an input of adder 118. The output of adder 118 is connected to the input of summation block 110. The output of summation block 110 drives the input of quantizer 116.

A clock source 104 clocks the digital-to-analog converter 106. The clock circuit 104 generally requires a high frequency crystals, such as a 55.2 MHz crystal 122, for clocking the digital-to-analog converter 106. A high frequency crystal is disadvantageous since high frequency crystals are generally very expensive and therefore limit the market acceptance of products in which they are incorporated.

One approach to decreasing the costs of the clocking circuit of FIG. 1 is to employ a lower frequency crystal in the clocking circuit along with a phase locked loop (PLL) frequency multiplier. For example, FIG. 2 illustrates a prior art sigma-delta conversion circuit 200 employing a clocking circuit 204 with a slower and lower-cost 27.6 MHz crystal 222, as opposed to a 55.2 MHz crystal. In order to achieve the same clock speed (55.2 MHz) as in the circuit of FIG. 1 a phase locked loop (PLL) clock doubler 205 is provided at the output of the clock circuit 204. The output of the phase locked loop clock doubler 205 is provided to a clock input of the digital-to-analog converter 206 in FIG. 2. The PLL is needed in FIG. 2 because the sigma-delta conversion circuit signal to noise ratio will degrade significantly if the clock speed is decreased by a factor of 2.

While the circuit of FIG. 2 can be an acceptable solution to the cost issue, the design and manufacturability of the pll 205 in FIG. 2 makes the solution not attractive. FIG. 2 adds complexity via the phase locked loop clock doubler circuit 205. The introduction of the phase locked loop clock doubler circuit 205 is further disadvantageous in that it introduces undesirable clock jitter noise across a wide frequency spectrum of the digital-to-analog converter clock signal. Clock jitter on the digital to analog converter clock signal will mix in the frequency domain with the digital input data to the digital-to-analog converter and produce serious degradation in the noise floor of the converter. For sigma-delta converter circuits, the clock jitter requirements to limit this degradation are extreme, requiring difficult PLL design. Therefore, while FIG. 2 solves the cost issue associated with the conversion circuit, it creates design and manufacturability problems.

For example, FIG. 3 illustrates an exemplary x-y plot of power spectral density (PSD) versus frequency. This graph 300 is representative of the characteristics of the sigma-delta conversion circuit 200 in FIG. 2. The graph 300 shows the power spectrum of the quantization noise 302 and the power spectrum of the phase locked loop induced clock jitter 304. The phase locked loop (PLL) induced clock jitter 304 results from imperfections in the performance of the phase locked loop 205. The quantization noise 302 results from converting the 17 bit input stream down to 3 bits at the output of the 3-bit quantizer 216.

As can be seen in FIG. 3, there is substantial overlap between the quantization noise 302 and phase locked loop induced clock jitter 304. As is known in the art, the digital to analog conversion process can be mathematically modeled such that the there is a "mixing" of the clock jitter with the digital data in the digital to analog converter. This mixing function is equivalent to convolving the spectra of the clock jitter and the digital data to arrive at the spectrum of the output signal of the digital to analog converter. In this process, the jitter spectrum will combine with the quantization noise spectrum in a similar frequency region and raise the noise floor in the signal band near dc. That is, quantization noise 302 and the phase locked loop induced clock jitter 304 will undesirably mix in the digital to analog conversion process, resulting in degraded signal quality at the output of DAC 206, a degradation that has been measured to be as high as 40 dB in some circumstances.

Therefore, the use of a higher frequency crystal suffers from cost limitations, while and the use of lower frequency crystal with a PLL results in the creation of wide-band clock jitter that results in degraded performance in the digital-to-analog conversion process.

Thus, while the use of a lower frequency crystal is desirable from a cost standpoint, its use results in degraded system performance. As such, there is a need in the integrated circuit (IC) and telecommunications industries for an improved digital-to-analog conversion architecture having both high performance and low cost.

SUMMARY OF THE INVENTION

These and other disadvantages in the prior art are overcome in a large part by a digital-to-analog (D/A) or analog-to-digital (A/D) conversion circuit according to the present invention. Briefly, a D/A or A/D conversion circuit taught herein is configured to localize the majority of the clock jitter noise to a narrow frequency band so that the clock jitter noise may be substantially separated or filtered from the quantization noise. By ensuring that nulls in the quantization noise coincide with higher power in the jitter noise, and vice versa, the system prevents the quantization noise and phase locked loop induced clock jitter from mixing into the signal band in the digital to analog conversion process, thereby achieving enhanced system performance at a lower cost.

BRIEF DESCRIPTION OF THE DRAWINGS

A better understanding of the invention is obtained when the following detailed description is considered in conjunction with the following drawings in which.

DETAILED DESCRIPTION OF THE INVENTION

Generally, the present invention is an improved digital-to-analog (D/A) or analog-to-digital (A/D) converter circuit used for high performance signal processing, such as that required in high performance audio and video, xDSL, G.lite, cable modems, high quality voice recognition, and like applications. The sigma delta converters taught herein use a lower-cost crystal clock source at a frequency operating at $f_s/N$ where $f_s$ is a sample frequency of the D/A or A/D and N is generally a finite positive integer greater than one. The $f_s/N$ signal is multiplied in frequency by a frequency multiplier (e.g., a clock doubler or a clock quadrupler) that does not have wide-band clock jitter components, as does a PLL. Specifically, the clock doubler can be implemented with an architecture that concentrates the clock jitter at localized regions in the frequency domain.

Due to the tight frequency confinement of the clock jitter noise, the sigma delta circuitry may be re-designed to place quantization noise nulls at non-zero frequency locations of the frequency spectrum that coincide with the concentration of clock jitter energy. These one or more additional nulls will result in reducing the noise floor degradation due to the mixing of the quantization noise and the clock jitter noise. In this embodiment, the spectrum of the clock jitter and spectrum of the data into the digital to analog converter are kept substantially mutually exclusive so that the result of the mixing operation in the digital to analog converter does not substantially increase the noise floor in the signal band near dc. With this invention, significant IC surface area may be saved (e.g., a more advanced multi-bit D/A or A/D is not needed) while up to a 40 dB improvement in digital to analog converter noise performance may be obtained in some cases at a lower cost.

In other embodiments, if the signal band is not near dc, but is centered on frequency fsignal, the approach would be to design the sigma-delta modulator so that the nulls in quantization noise where placed at a frequency spacing fsignal from the spectral location(s) of the clock jitter. In this way, the mixing of the quantization noise and clock jitter will not degrade the performance of the digital to analog converter in the signal band frequency region.

The invention may be further understood with specific reference to FIGS. 4–9.

Figure 4:
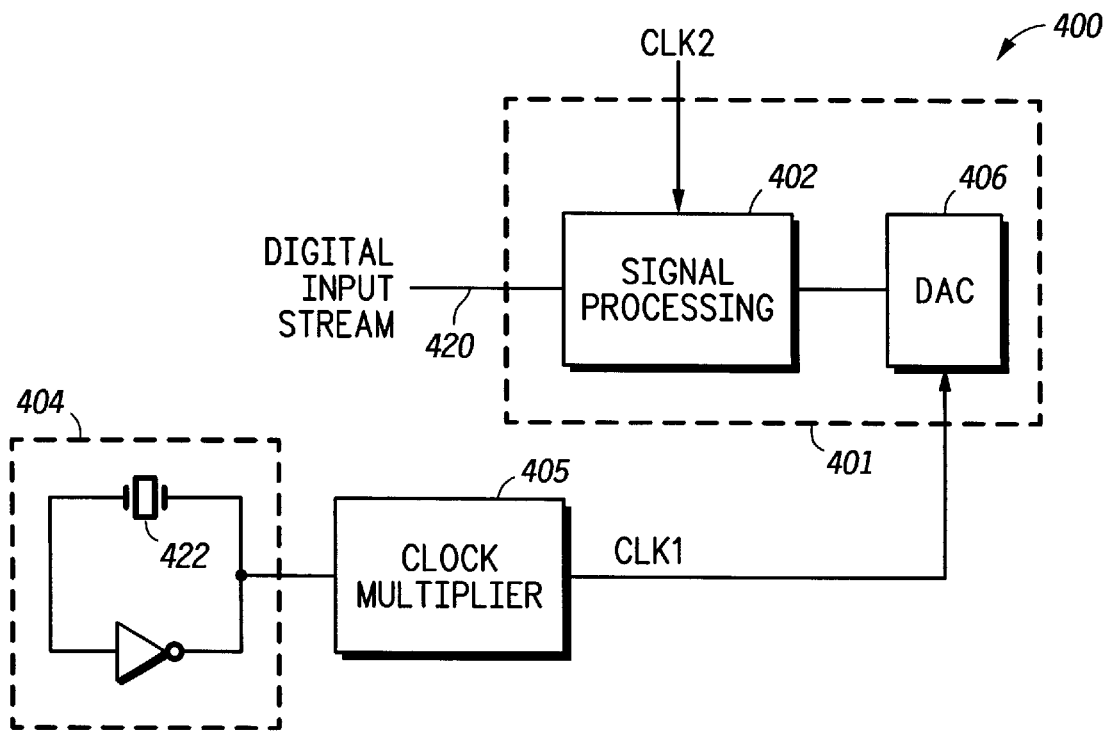
FIG. 4 is a block diagram of a low frequency crystal digital-to-analog (D/A) conversion architecture with improved performance in accordance with one embodiment of the present invention.

Turning now to FIG. 4, FIG. 4 illustrates a digital-to-analog (D/A) conversion architecture 400. The digital-to-analog conversion architecture 400, according to an embodiment of the present invention, is configured to separate the spectrum of clock-multiplier-induced clock jitter from that of the spectrum of the digital data input to a digital-to-analog converter, as will be discussed in greater detail below. Broadly speaking, the digital-to-analog conversion architecture 400 includes a digital-to-analog conversion unit 401 which receives a digital input signal 420. The digital-to-analog conversion unit 401 includes a signal processing unit 402 and a digital-to-analog converter (DAC) 406. The digital-to-analog converter receives, as an input, the output of the signal processing unit 402. Signal processing block 402 processes the digital input stream in such a way that the spectrum of the digital data that is output to digital to analog converter 406 has frequency domain nulls. These nulls are placed in the frequency domain so that the mixing function of digital data with clock jitter from clock multiplier 405 in digital to analog converter 406 results in acceptable signal to noise performance in the digital to analog conversion process. The signal processing block 402 could be a sigma-delta modulator, or alternate approaches of digitally processing data before the digital to analog converter process. The digital-to-analog converter 406 further receives as an input a clock (CLK1). The clock (CLK1) is provided as an output from a clock generator 404 and a clock multiplier circuit 405. The clock generator 404 includes a relatively low frequency crystal 422 that has a relatively low cost. The output of the clock generator 404 is provided to the clock multiplier 405. The clock multiplier circuit 405 may be embodied as a high quality phase locked loop or another clock multiplier circuit such as an edge triggered clock multiplier (see FIG. 8) with the latter being optimal for cost and performance reasons. The clock multiplier circuit 405 will multiply the input frequency by an integer multiple, N, when the crystal 422 provides a frequency signal at $f_s/N$ and the DAC is designed for operation at the sampling frequency $f_s$.

Figure 8:
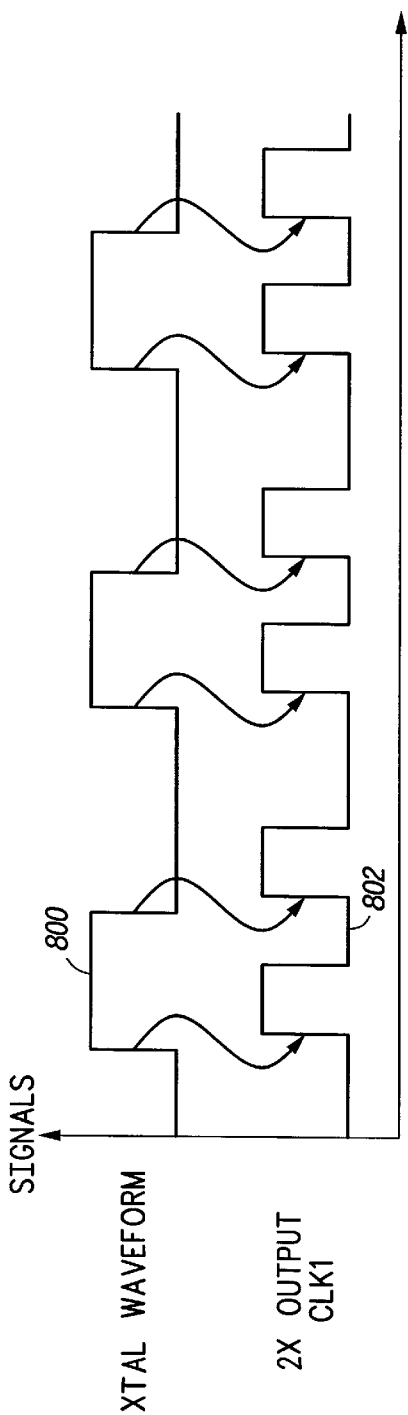
FIG. 8 is a diagram illustrating exemplary clock waveforms at the input and output of a clock doubler according to the present invention.

In particular, the clock multiplier 405 is configured to generate a clock CLK1 based on the frequency of the crystal 422, such that the resulting jitter energy is concentrated at a single frequency of $f_s/2$ when N=2. For one example of such an edge-triggered clock multiplier, FIG. 8 illustrates exemplary crystal waveform 800 and an exemplary output 802 of the frequency multiplier 405. In the example shown in FIG. 8, the clock multiplier 405 is a 2×multiplier, or doubler. The doubler output is generated from the crystal waveform 800 such that every crystal waveform clock cycle 800 clock transition causes a corresponding clock doubler output pulse. A rising edge of the crystal signal 800 induces a first clock cycle in the signal 802, and a falling edge of the signal 800 cause the second cycle in the clock signal 802 thereby resulting in the clock doubling function. Since the crystal clock source has a minimal amount of jitter and the multiplier 405 functions as an edge-triggered doubler, the resultant clock jitter is localized at narrow frequency bands at multiples of $f_s/N$.

The digital-to-analog conversion unit 401 may also receive a second clock (CLK2) which may be employed for one or more signal processing functions. For example, CLK2 may be used to run the signal processing circuit 402 and perform other functions where jitter reduction may not be as critical. It is noted that CLK2 may be at the same frequency as CLK1 or, in fact, may be the same signal as CLK1 in some embodiments.

Figure 5:
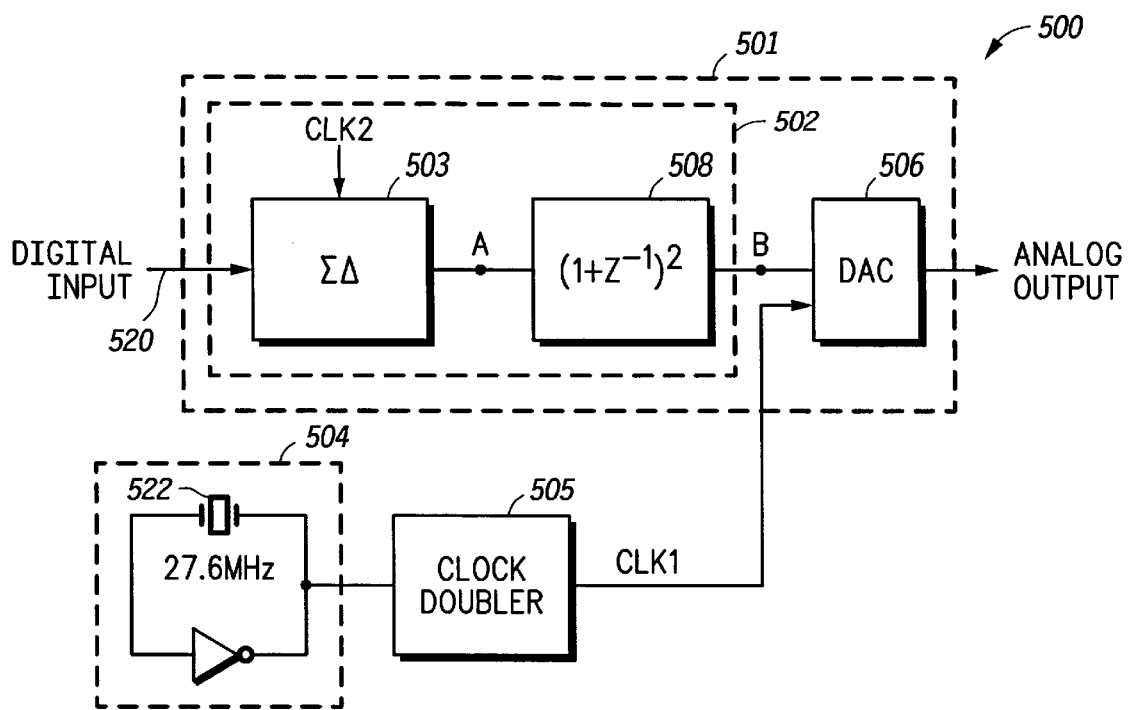
FIG. 5 is a diagram of an exemplary digital-to-analog conversion architecture in accordance with one embodiment of the present invention.

Turning now to FIG. 5, a diagram of a specific implementation of the digital-to-analog conversion architecture of FIG. 4 is shown. The digital-to-analog conversion architecture 500 of FIG. 5 includes a digital-to-analog conversion unit 501, which includes a signal processing unit 502 and a digital-to-analog converter (DAC) 506. A clock (CLK1) clocks the digital-to-analog converter 506. The clock CLK1 is generated by a clock generator 504 which is provided to a clock doubler 505 in a manner similar to that discussed above.

In the embodiment illustrated in FIG. 5, the clock generator 504 includes a crystal 522 having a frequency of 27.6 MHz in one form. The signal-processing unit 501, according to the embodiment illustrated, includes a sigma-delta modulator 503 and a quantization noise filter 508. The sigma-delta modulator 503 receives as input a desired digital signal input 520. The sigma-delta modulator 503 functions to convert a multi-bit digital input down to fewer bits. The sigma-delta modulator 503 produces an output at node A that is an input to the quantization noise filter 508. The quantization noise filter 508 provides an output at node B to the digital-to-analog converter 506. The spectral density of noise on the nodes A and B is discussed with reference to FIG. 6.

Figure 6:
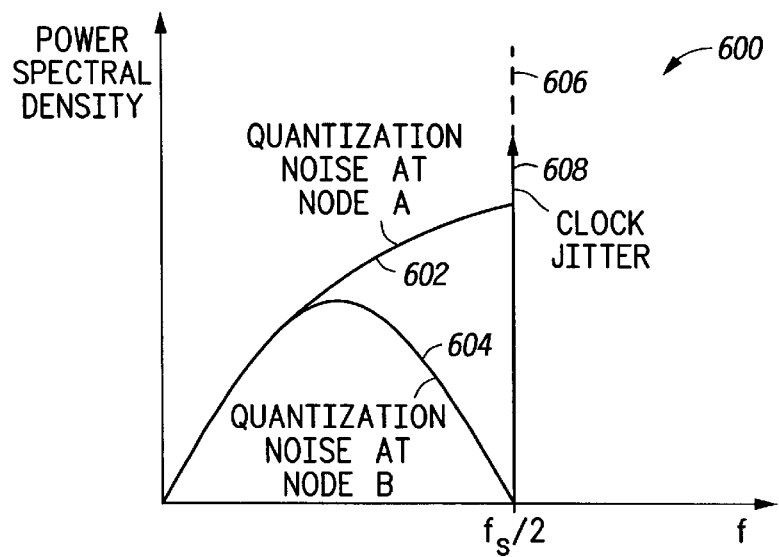
FIG. 6 is a power spectral density graph of the digital-to-analog conversion architecture of FIG. 5.

Broadly speaking, the quantization noise filter 508, which may in one form perform the second order function of $(1+z^{-1})^2$, reduces the frequency content of the input data to DAC 506, at the frequencies at which there is significant clock jitter on the clock line CLK1. The function of the quantization noise filter 508 is illustrated with reference to FIG. 6. FIG. 6 illustrates a graph 600 of power spectral density versus frequency for the circuit of FIG. 5. The graph 600 illustrates quantization noise 602 at node A and processed quantization noise 604 at node B.

As can be seen, the quantization noise at node B 604 has a reduced power spectral density relative to the power spectrum density of the node A 602 at the frequency fs/2. Also shown in FIG. 6 is the power spectral density of the clock jitter 608, which is concentrated at a tight frequency-band around the frequency $f_s/2$ as such is described with reference to FIG. 8 above. Thus, the function of the quantization noise filter 508 (FIG. 5) is to reduce the power spectral density of the quantization noise at node B relative to the quantization noise at node A. It is noted that, with the power spectral density at the node B, density 604 has a null at $f_s/2$. While "null" usually implies a zero power output, it should be noted that a significant reduction (low, but non-zero power value) at the frequency $f_s/2$ is enough to be characterized as a null for the purposes discussed herein. In other words and in certain applications, it may be sufficient to merely reduce the quantization noise power spectral density rather than reduce it to zero. Thus, FIG. 6 is exemplary only and more than one null may be placed into the power spectral density in addition to 0 Hz and $f_s/2$ Hz as shown in FIG. 6.

In addition, the quantization noise filter 508 may be any other filter of any order that is sufficient to reduce the quantization noise to desirable levels at the clock jitter frequency, which is $f_s/2$ in this embodiment. An exemplary transfer function for such a quantization noise filter is given by the equation $H(z)=(1+Z^{-1})^2$.

Figure 7:
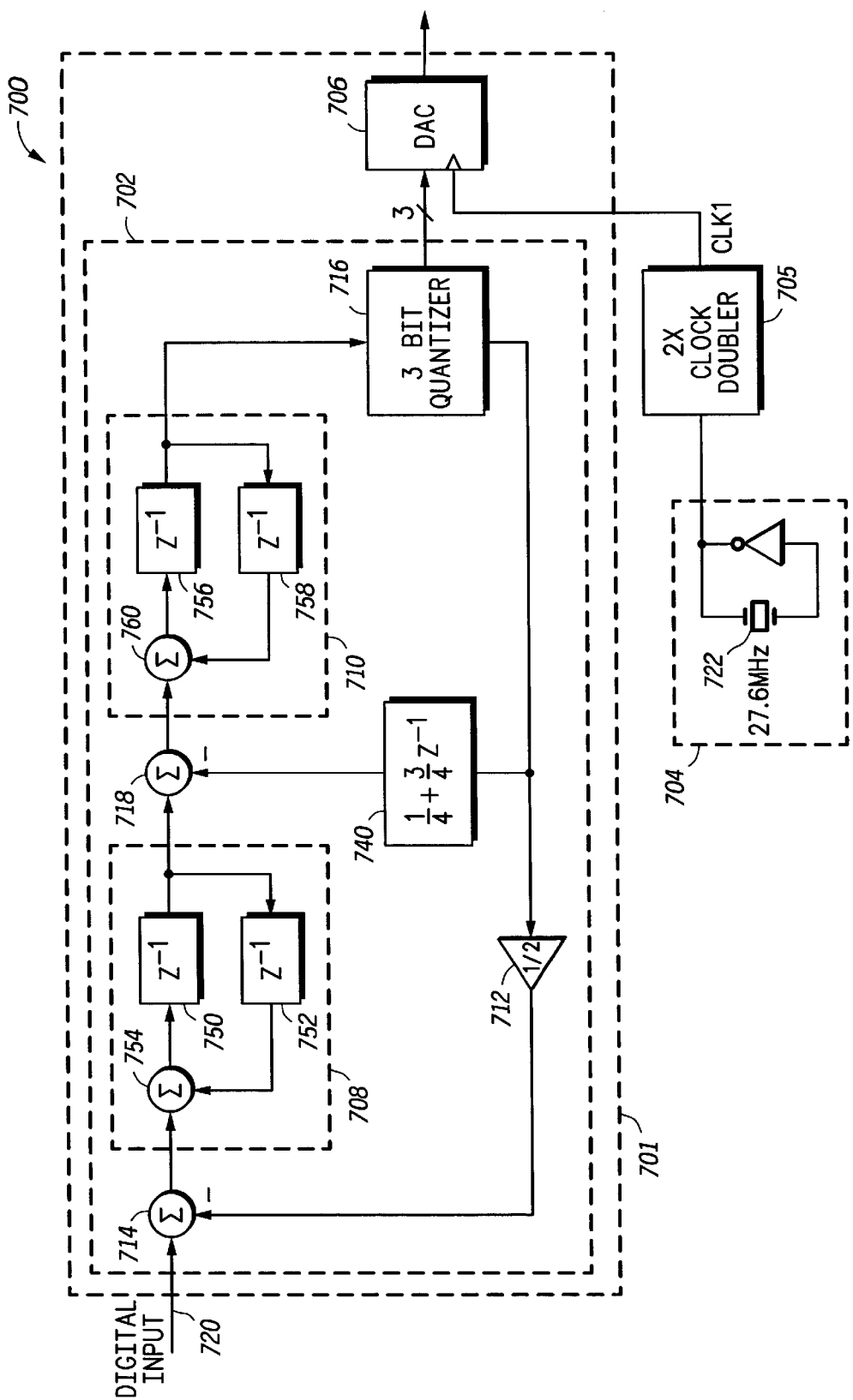
FIG. 7 is a diagram illustrating a digital-to-analog conversion architecture according to another embodiment of the invention.

FIG. 7 illustrates an alternative embodiment of a digital-to-analog converter architecture 700 according to the present invention. The digital-to-analog converter architecture 700 includes a digital-to-analog conversion unit 701 having a signal-processing unit 702, the output of which is provided to a digital-to-analog converter (DAC) 706. According to the embodiment illustrated, the signal processing unit 702 is embodied as an improved second order sigma-delta modulator having a transfer function defined substantially as follows:

$$Y(z) = \frac{z^{-2}X(z) + e_n(1-z^{-1})^2(1+z^{-1})^2}{f(z^{-1})}$$

where X(z) is the input 720 to the signal processing unit 702, Y(z) is the output, $f(z^{-1})$ is some function of z, and $e_n$ is representative of the quantization noise, (which is commonly modeled as additive white noise). While Y(z) is shown herein with second order noise shaping around dc and second order noise shaping around the clock jitter region of fs/2, the invention is beneficial to any order sigma-delta modulator or any order of noise shaping around the clock jitter frequency or frequencies. The invention can easily be used to improve performance on any generalized data stream that suffers from clock jitter induced noise degradation in a digital-to-analog converter. The digital data stream is filtered in such a way that the frequency content of the data is removed that will mix with the clock jitter spectrum in the digital to analog converter. The approach is most successful when the clock jitter has been localized to a small frequency region or regions, and a null is provided in the digital data at those frequencies. However, it is not necessary that a the digital filter produce a null, it may merely reduce the frequency content of the data in the region of interest.

Figure 1:
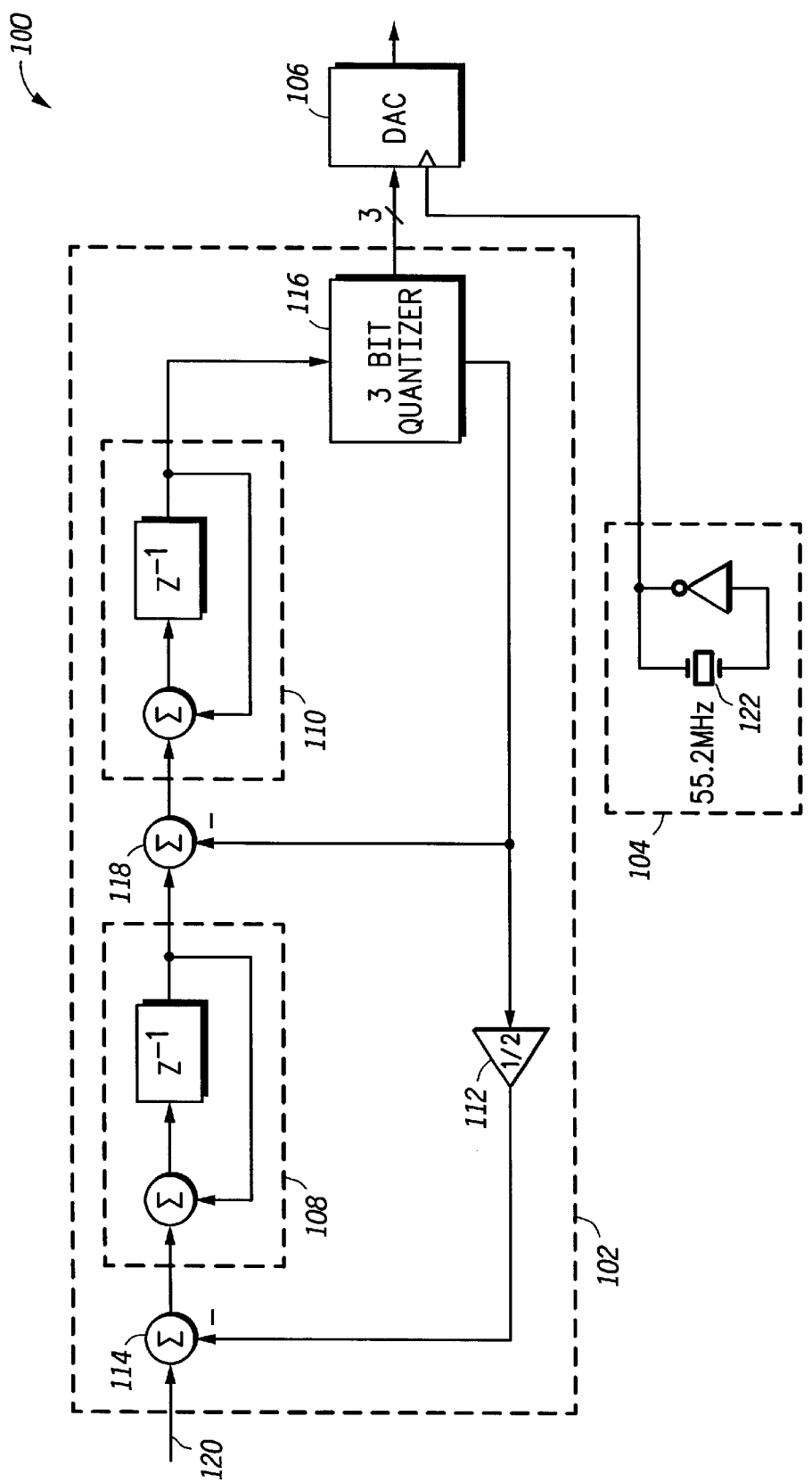
FIG. 1 is a diagram illustrating a high frequency crystal sigma delta digital-to-analog (D/A) conversion circuit according to the prior art.
Figure 2:
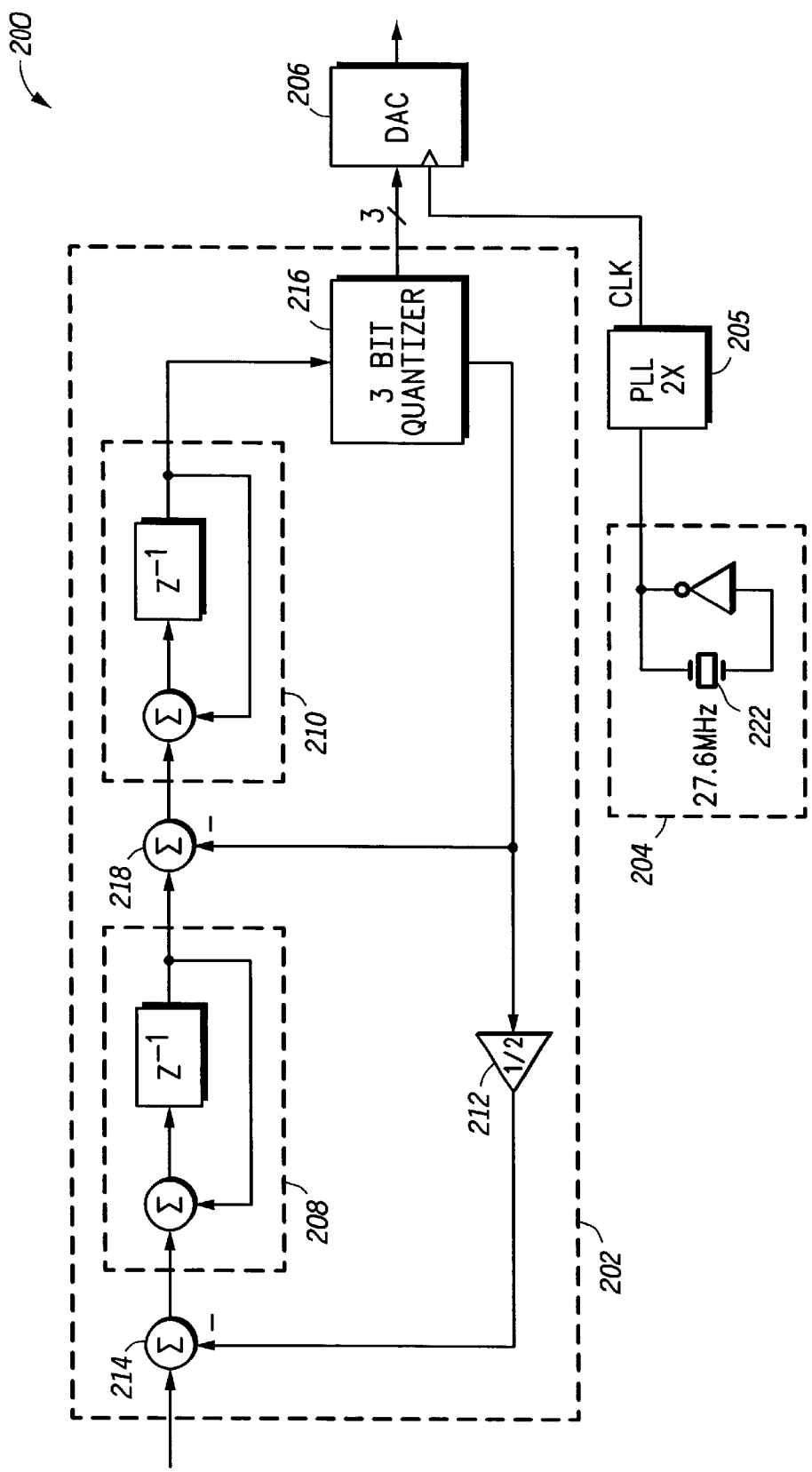
FIG. 2 is a diagram illustrating a low frequency crystal and phase lock loop (PLL) sigma delta digital-to-analog converter circuit according to the prior art.
Figure 3:
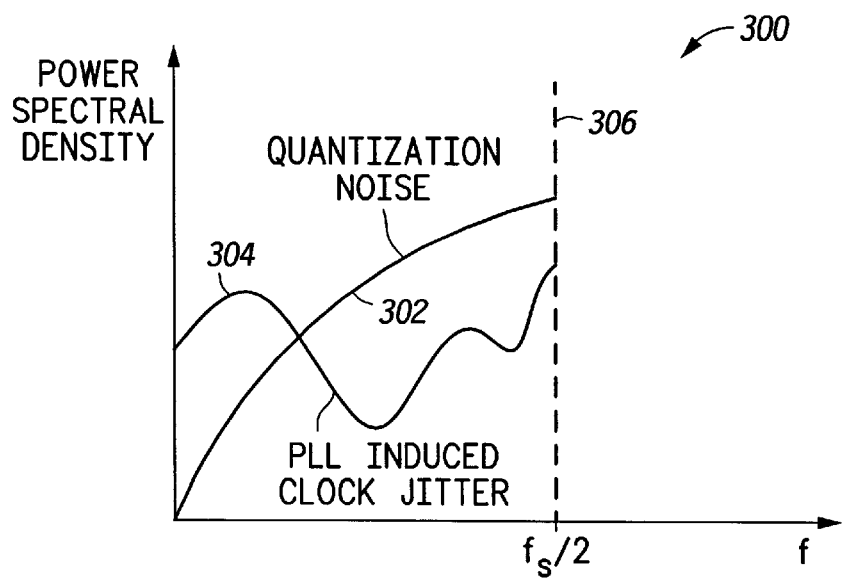
FIG. 3 is a graph illustrating the problematic power spectral density for the sigma delta digital-to-analog conversion circuit of FIG. 2.

In another form, the circuit of FIG. 7 may be formed on the same die intermixed with the circuit of FIG. 5, the circuit of FIG. 1, or other filters of different order or form. The formation of several alternative structures onto a single die is advantageous since an end user may dynamically configure (by setting one or more control bits, executing a software instruction, or by automatic CPU detection) the performance of his system. Furthermore, the system can dynamically accommodate multiple crystals or sample frequencies $f_s$ by simply changing some switches in a dynamic and programmable manner. Therefore, different crystals may be selectively applied to the circuit of FIG. 7 where the circuit dynamically adjusts itself between different modes of operation.

In FIG. 7, the DAC 706 receives a clock input CLK1 which is the output of a clock doubler 705. The clock doubler 705 receives its input from a clock generator 704. According to one embodiment, the clock generator 704 includes a 27.6 MHz crystal 722 and $f_s$=55.2 MHz. It should be noted that many other frequencies may be used in the embodiments herein. The clock CLK1 is generated such that it has a jitter power spectral density concentrated at the frequency $f_s/2$ (i.e., half the sampling frequency $f_s$). Alternate embodiments of the clock multiplier that create more broad band jitter could also benefit from the improved sigma-delta modulator as shown.

The digital signal-processing block 702 receives a digital input 720 to a summation circuit 714. The output of the summation circuit 714 is provided to a multi-frequency high gain circuit 708. The multi-frequency high gain circuit 708 has high gain at DC and fs/2. According to the embodiment shown, the multi-frequency high gain circuit 708 has a transfer function substantially defined by:

$$H(z) = \frac{z^{-1}}{1 - z^{-2}}$$

As illustrated, the circuit 708 is implemented as a summation circuit 754, a delay operator 750 and a delay operator 752 within a feedback path. The delay operators 750, 752 may be embodied as latches or other temporary storage devices.

The output of the multi-frequency high gain circuit 708 is provided to a summation circuit 718, the output of which is provided to another multi-frequency high gain circuit 710. However, the circuit of FIG. 7 places two overlapping nulls at the frequency $f_s$, whereas the circuit of FIG. 7 may be changed to place only one null at the frequency $f_s$. Such may be done by either removing the element 752 or removing element 758 and altering element 740 from the circuit of FIG. 7 to form other embodiments.

Like the multi-frequency high gain circuit 708, the multi-frequency high gain circuit 710 includes a summation circuit 760, a delay operator 756, and a delay operator 758 within a feedback loop. Again, the delay operators 756, 758 may be embodied as latches or other temporary storage devices. The output of the multi-frequency high gain circuit 710 is provided to a quantizer, such as a 3-bit quantizer 716. The output of the 3-bit quantizer is provided to a feedback loop.

A gain factor 712 is provided as negative feedback from the quantizer output to the summation circuit 714. A feedback filter 740 is provided in a negative feedback loop from the quantizer output to the summation circuit 718. Together, the feedback filter 740 and the multi-frequency high gain circuit 710 function to produce a high gain at DC and fs/2. The feedback loop filter 740 may be embodied, for example, as a delay operator and generally may have a transfer function derived to optimize performance in a particular application. In the implementation illustrated, the feedback loop filter 740 has a transfer function of $H(z)=a+b\ z^{-1}$. In a preferred form, $H(z)=\frac{1}{4}+\frac{3}{4}(\frac{3}{4})z^{-1}$ where $a=\frac{1}{4}$ and $b=\frac{3}{4}$. In other embodiments, other values for a and b may be used.

It is noted that while the embodiment of FIG. 7 employs both a multi-frequency high gain circuit 708 and a multi-frequency high gain circuit 710, desired performance may be obtained using only one or the other of the circuit 708 or 710. Thus, FIG. 7 is exemplary only.

Figure 9:
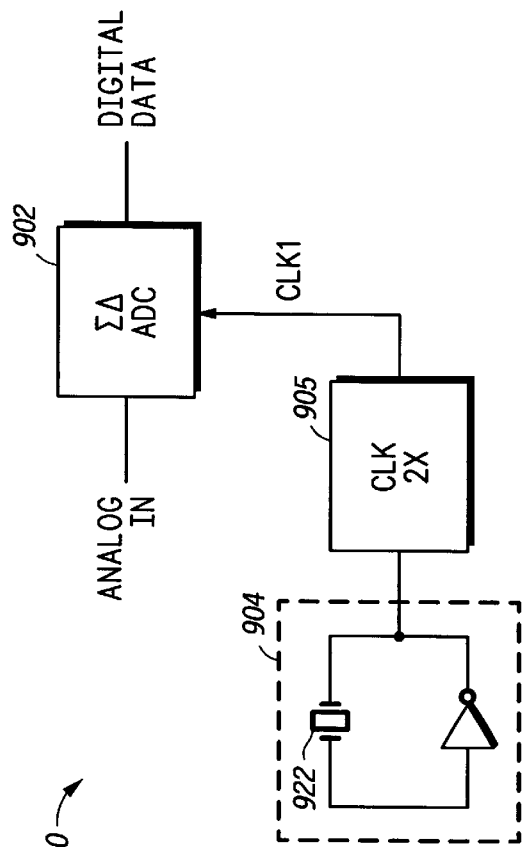
FIG. 9 is a block diagram illustrating an analog-to-digital (A/D) conversion architecture according to one embodiment of the invention.

It is further noted that, while described above in the context of digital-to-analog conversion, the teachings of the present invention are equally applicable to an analog-to-digital conversion. In particular, as shown in FIG. 9, an analog-to-digital converter 900 may employ an analog-to-digital signal processing architecture 902 which reduces quantization noise power spectrum at the frequency of the clock jitter power spectrum. The analog-to-digital converter 900 thus includes a clock source 904 and a clock multiplier 905 which are input to the analog-to-digital signal converter architecture 902. For example, the analog-to-digital signal converter architecture 902 may be generally similar to the digital-to-analog signal converter architecture 702 of FIG. 7.

Although the present invention has been described with reference to a specific embodiment, further modifications and improvements will occur to those skilled in the art. For example, the concepts taught herein may be extended so that a crystal of $f_s/4$ is used whereby four nulls are placed in the frequency spectrum between 0 Hz and fs Hz in FIG. 7. For example, an even lower cost crystal of roughly 13.8 MHz may be used with a 4× clock multiplier to output $f_s=55.2$ MHz. In this case, the sigma delta circuitry would create nulls or low energy regions around 0 Hz, $f_s/4$, $f_s/2$, and maybe $3f_s/4$ depending upon system requirements. It is to be understood, therefore, that the invention encompasses all such modifications that do not depart from the spirit and scope of the invention as defined in the appended claims.

What is claimed is:

1. An apparatus comprising:
   a digital-to-analog converter;
   a clock circuit coupled to provide a clock signal to the digital-to-analog converter; and
   circuitry coupled to the data input of the digital-to-analog converter which processes incoming data, the circuitry comprising a sigma delta circuit which provides processed data to a null placement circuit that is coupled to the data input of the digital-to-analog converter.

2. The apparatus of claim 1 wherein a first of the at least two different frequencies is substantially near DC and a second frequency is substantially near $f_s/2$ where $f_s$ is a sampling frequency of the digital-to-analog converter.

3. The apparatus of claim 1 wherein the at least two different frequencies comprise at least four different frequencies.

4. The apparatus of claim 3 wherein one of the at least four different frequencies is located at $f_s/4$ where $f_s$ is a sampling frequency of the digital-to-analog converter.

5. The apparatus of claim 1 wherein the circuitry comprises a first circuit comprising:
   a first adder with a first input for receiving a function of the incoming data, a second input, and an output;
   a first storage device having an input coupled to the output of the first adder and an output; and
   a second storage device having an input coupled to the output of the first storage device and an output coupled to the second input of the first adder.

6. The apparatus of claim 5 wherein the circuitry comprises a second circuit coupled in series with the first circuit, wherein the second circuit comprises:
   a second adder with a first input for receiving a function of the incoming data, a second input, and an output;
   a third storage device having an input coupled to the output of the second adder and an output; and
   a fourth storage device having an input coupled to the output of the third storage device and an output coupled to the second input of the second adder.

7. The apparatus of claim 6 wherein a third adder lies between the first and second circuits wherein an input of the third adder is a function of at least two different time domain inputs to the digital-to-analog converter.

8. The apparatus of claim 1 wherein the circuitry comprises a feedback circuit that changes an output of the circuitry based upon a function of at least two different time domain outputs from the circuitry.

9. The apparatus of claim 8 wherein the feedback circuit implements $az^0+bz^{-1}$ wherein a is a constant, b is a constant, $z^0$ is representative of the present output of the circuitry and $z^{-1}$ is representative of a past output of the circuitry.

10. The apparatus of claim 8 wherein a is substantially equal to $\frac{1}{4}$ and b is substantially equal to $\frac{3}{4}$.

11. The apparatus of claim 10 wherein the null placement circuit creates a null within a frequency spectrum between zero Hertz and the sampling frequency of the digital-to-analog converter.

12. The apparatus of claim 11 wherein the null placement circuit performs the operation of $(1+z^{-1})^2$ on incoming data.

13. The apparatus of claim 1 wherein an L-bit quantizer is coupled to the digital-to-analog converter wherein L is a positive finite integer less than four.

14. An apparatus comprising:
a clock input for providing a repeating clock signal;
a clock multiplier coupled to the clock input for increasing a frequency of the repeating clock signal to create an internal clock signal;
a sigma delta circuit for receiving and processing a stream of digital data;
a null placement circuit for placing a frequency domain null at a non-zero frequency in the power spectral density of the output data from the sigma-delta circuitry;
a digital-to-analog converter coupled to the null placement circuit where the digital-to-analog converter is clocked by the internal clock.

15. The apparatus of claim 14 wherein the frequency null is placed at a frequency that is a function of a frequency of the repeating clock signal.

16. The apparatus of claim 14 wherein the clock multiplier is a clock doubler that creates a first internal clock cycle from a rising edge of the repeating clock signal and a second internal clock cycle from a falling edge of the repeating clock signal.

17. The apparatus of claim 16 wherein the frequency null is placed at a frequency that is equal to the frequency of the repeating clock signal.

18. An apparatus comprising:
a clock input for providing a repeating clock signal;
a clock multiplier coupled to the clock input for changing a frequency of the repeating clock signal to create an internal clock signal;
a first adder having a first input for receiving a digital stream of data, a second input, and an output;
a first circuit having a high gain at at least two different frequencies, the first circuit having an input coupled to the output of the first adder and an output;
a second adder having an input coupled to the output of the first circuit, a second input, and a output;
a second circuit having a high gain at at least two different frequencies, the second circuit having an input coupled to the output of the second adder and an output;
a quantizer circuit having an input coupled to the output of the second circuit and an output;
a gain circuit having an input coupled to the output of the quantizer circuit and a output coupled to the second input of the first adder;
a feedback circuit coupled between the output of the quantizer circuit and the input of the second adder; and
a digital-to-analog converter coupled to the quantizer circuit and the internal clock signal.

19. The apparatus of claim 18 wherein one of either the first or second circuit is implemented as a circuit comprising:
an internal adder with a first input for receiving the incoming data, a second input, and an output;
a first storage device having an input coupled to the output of the internal adder and an output; and
a second storage device having an input coupled to the output of the first storage device and an output coupled to the second input of the internal adder.

20. The apparatus of claim 18 wherein both of the first and second circuits are implemented as a circuit comprising:
an internal adder with a first input for receiving the incoming data, a second input, and an output;
a first storage device having an input coupled to the output of the internal adder and an output; and
a second storage device having an input coupled to the output of the first storage device and an output coupled to the second input of the internal adder.

21. The apparatus of claim 18 wherein the feedback circuit provides as input to the second input of the second adder $az^0 + bz^{-1}$ wherein a is a constant, b is a constant, $z^0$ is representative of the present output of the quantizer and $z^{-1}$ is representative of a past output of the quantizer.

22. The apparatus of claim 21 wherein a is substantially equal to ¼ and b is substantially equal to ¾.

23. An apparatus comprising:
an digital-to-analog converter; and
a circuit coupled to provide input data to the digital-to-analog converter wherein the circuit signal processing is substantially defined by the following operation:

$$\text{output } Y = (z^{-2}X + e_n(1-z^{-1})^2(1+z^{-1})^2)/f(z^{-1})$$

wherein
X is the circuit input data stream;
$z^{-1}$ is the data value delayed by one sample;
$z^{-2}$ is a data value delayed by two sample times; and
$e_n$ is representative of quantization noise.

24. An apparatus comprising:
a clock input for providing a repeating clock signal;
a clock multiplier coupled to the clock input for changing a frequency of the repeating clock signal to create an internal clock signal;
a first adder having a first input for receiving a digital stream of data, a second input, and an output;
a first circuit having a high gain at a DC frequency, the first circuit having an input coupled to the output of the first adder and an output;
a second adder having an input coupled to the output of the first circuit, a second input, and a output;
a second circuit having a high gain at two different frequencies, the second circuit having an input coupled to the output of the second adder and an output;
a quantizer circuit having an input coupled to the output of the second circuit and an output;
a gain circuit having an input coupled to the output of the quantizer circuit and a output coupled to the second input of the first adder;
a feedback circuit coupled to the output of the quantizer circuit and the second input of the second adder; and
a digital-to-analog converter coupled to the quantizer circuit and the internal clock signal.

25. An apparatus comprising:
a clock input for providing a repeating clock signal;
a clock multiplier coupled to the clock input for changing a frequency of the repeating clock signal to create an internal clock signal;
a first adder having a first input for receiving a digital stream of data, a second input, and an output;
a first circuit having a high gain at two different frequencies, the first circuit having an input coupled to the output of the first adder and an output;
a second adder having an input coupled to the output of the first circuit, a second input, and a output;

a second circuit having a high gain at a DC frequency, the second circuit having an input coupled to the output of the second adder and an output;

a quantizer circuit having an input coupled to the output of the second circuit and an output coupled to the second input of the second adder;

a feedback circuit coupled to the output of the quantizer circuit and the input of the second adder; and a digital-to-analog converter coupled to the quantizer circuit and the internal clock signal.

26. An apparatus having quantization noise between DC and a sampling frequency and having clock jitter noise at at least one localized frequency between DC and the sampling frequency, the apparatus comprising:

a digital-to-analog converter operating at the sampling frequency; and a circuit providing data input to the digital-to-analog converter wherein the circuit places a null in the data stream at a frequency that coincides with the clock jitter noise.

27. An apparatus comprising:

a digital-to-analog converter operating at a sampling frequency $f_s$;

a crystal input for providing an oscillating signal operating at the frequency of roughly $f_s/N$;

a clock multiplier coupled between the crystal and the digital-to-analog converter for multiplying the frequency of the clock by a factor of N in order to produce a clock operating at the sampling frequency $f_s$ for use by the digital-to-analog converter; and a circuit coupled to provide data to the digital-to-analog converter wherein the circuit creates at least one frequency domain null based upon the value of N to reduce the effects of clock jitter in the digital-to-analog conversion for frequencies less than $f_s$.

28. An apparatus comprising:

an input circuit comprising:
   an adder having a first input, a second input, and an output;
   a first storage device having an input coupled to the output of the adder and an output; and
   a second storage device having an input coupled to the output of the first storage device and an output coupled to the second input of the adder; and a digital-to-analog converter receiving an output from the input circuit.

29. An apparatus comprising:

an adder having a first input, a second input, and an output;

a digital-to-analog converter having an output and an input that is a function of the output of the adder; and a feedback circuit providing a value, that is a function of the present input of the digital-to-analog converter and a past input of the digital-to-analog converter, to the second input of the adder.

30. An apparatus comprising:

a crystal input for receiving a repeating clock signal operating at a frequency of $f_s/2$ where $f_s$ is a desired sampling frequency;

a clock doubler coupled to the crystal input wherein the clock doubler creates a first internal clock cycle from a rising edge of the repeating clock signal and a second internal clock cycle from a falling edge of the repeating clock signal to create an internal clock that has a frequency substantially equal to $f_s$; and providing the internal clock signal to a digital-to-analog converter.

31. An apparatus comprising:

an input for selectively receiving one of at least two different clock frequency signals;

a frequency multiplying circuit coupled to the input for changing the frequency of the selected clock frequency signal;

a digital-to-analog converter coupled to receive an output of the frequency multiplying circuit;

a circuit for providing data to an input of the digital-to-analog converter, the circuit selectively applying at least two frequency domain nulls to the data; and a control mechanism to set the multiplication factor of the frequency multiplying circuit and to place the at least two frequency domain nulls depending on which of the at least two different clock frequency signals is selected.

32. The apparatus of claim 31 wherein the input receives one of at least three different clock frequency signals at a selected frequency wherein the control mechanism distinguishes between the three different clock frequencies.

33. An apparatus comprising:

an analog-to-digital converter having circuitry coupled which frequency processes incoming data to result in quantization noise that has nulls located at at least two different frequencies; and a clock circuit coupled to provide a clock signal to the analog-to-digital converter.

34. An apparatus comprising:

a clock input for providing a repeating clock signal;

a clock multiplier coupled to the clock input for changing a frequency of the repeating clock signal to create an internal clock signal;

an adder having a first input for receiving a digital stream of data, a second input, and an output;

a gain circuit having a high gain at at least two different frequencies, the gain circuit having an input coupled to the output of the adder and an output;

a quantizer circuit having an input coupled to the output of the gain circuit and an output;

a feedback circuit coupled to the output of the quantizer circuit and the input of the adder; and a digital-to-analog converter coupled to the quantizer circuit and the internal clock signal.

35. An apparatus comprising:

a converter coupled to a clock signal input;

a sigma delta circuit coupled to the converter that reduces quantization noise around a frequency where clock jitter noise is substantially present; and a quantization noise filter coupled between the converter and the sigma delta circuit, the quantization noise filter reducing power spectral density of quantization noise at an output of the quantization noise filter relative to quantization noise at an input of the quantization noise filter.

* * * * *